United States Patent
Mikami et al.

(10) Patent No.: US 7,847,389 B2
(45) Date of Patent: Dec. 7, 2010

(54) SEMICONDUCTOR PACKAGE, ELECTRONIC PART AND ELECTRONIC DEVICE

(75) Inventors: Nobuhiro Mikami, Tokyo (JP); Shinji Watanabe, Tokyo (JP); Junya Sato, Tokyo (JP); Atsumasa Sawada, Tokyo (JP)

(73) Assignee: NEC Corporation, Tokyo (JP)

( * ) Notice: Subject to any disclaimer, the term of this patent is extended or adjusted under 35 U.S.C. 154(b) by 233 days.

(21) Appl. No.: 12/093,896

(22) PCT Filed: Nov. 13, 2006

(86) PCT No.: PCT/JP2006/322524
§ 371 (c)(1),
(2), (4) Date: May 15, 2008

(87) PCT Pub. No.: WO2007/058134
PCT Pub. Date: May 24, 2007

(65) Prior Publication Data
US 2009/0096080 A1    Apr. 16, 2009

(30) Foreign Application Priority Data
Nov. 15, 2005    (JP)    ............................. 2005-330719

(51) Int. Cl.
*H01L 23/48*    (2006.01)
(52) U.S. Cl. ................. 257/690; 257/688; 257/730; 257/E23.078; 257/E23.169; 257/E23.194
(58) Field of Classification Search ............. 257/690, 257/685, 686, 723, 777, 688, 692, 727, 729, 257/730, 734, E23.169, E23.78, E23.194
See application file for complete search history.

(56) References Cited

U.S. PATENT DOCUMENTS

| 5,805,422 A | 9/1998 | Otake et al. | |
|---|---|---|---|
| 6,028,365 A | * 2/2000 | Akram et al. | ............... 257/778 |

(Continued)

FOREIGN PATENT DOCUMENTS

DE    101 04 427    7/2001

(Continued)

OTHER PUBLICATIONS

International Search Report for PCT/JP2006/322524.

(Continued)

*Primary Examiner*—Jasmine J Clark
(74) *Attorney, Agent, or Firm*—Young & Thompson

(57) ABSTRACT

Even when a substrate on which a semiconductor package has been mounted is made curved, stress upon electrical connections is mitigated, thereby eliminating faulty connections and improving connection reliability. A semiconductor chip has electrodes on a second face thereof. Support blocks, capable of bending and flexing, are placed at two locations on a peripheral edge of a first face of the semiconductor chip. An interposer is placed so as to span the support blocks with the support blocks interposed between itself and the semiconductor chip, and has a wiring pattern in a flexible resin film. Two end portions of the interposer are folded back onto the side of the second face of the semiconductor chip, and the wiring pattern thereof is electrically connected to the electrodes of the semiconductor chip.

29 Claims, 17 Drawing Sheet

U.S. PATENT DOCUMENTS

| | | |
|---|---|---|
| 6,087,716 A | 7/2000 | Ikeda |
| 6,372,527 B1 | 4/2002 | Khandros |
| 2001/0003049 A1 | 6/2001 | Fukasawa et al. |
| 2002/0044423 A1 | 4/2002 | Primavera et al. |
| 2002/0135050 A1 | 9/2002 | Kimura |
| 2004/0104476 A1 | 6/2004 | Iwamoto |
| 2004/0115920 A1 | 6/2004 | Yamazaki et al. |

FOREIGN PATENT DOCUMENTS

| | | |
|---|---|---|
| JP | 8-335663 | 6/1995 |
| JP | 9-167811 | 12/1995 |
| JP | 10-125705 | 10/1996 |
| JP | 10-223826 | 2/1997 |
| JP | 2002-110839 | 9/2000 |
| JP | 2000-277683 | 10/2000 |
| JP | 2007-005837 | 1/2007 |
| KR | 10-1999-0063586 | 12/1999 |
| KR | 10-2000-0071256 | 11/2000 |
| KR | 10-2004-0033070 | 4/2004 |
| WO | 98/02919 | 1/1998 |
| WO | 03/030602 | 1/2003 |

OTHER PUBLICATIONS

Korean Patent Office issued a Korean Office Action, Application No. 519980958731.

European Search Report - EP 06 83 2536 - Aug. 19, 2010.

* cited by examiner

FIG. 1A (FIRST EXAMPLE)
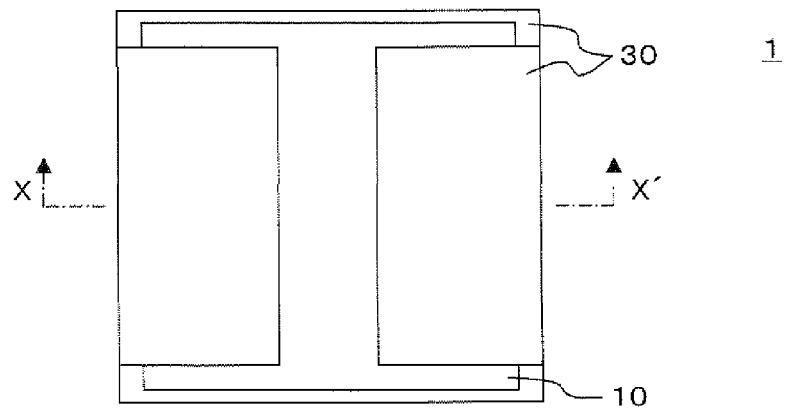
FIG. 1B  X-X' (FIRST EXAMPLE)
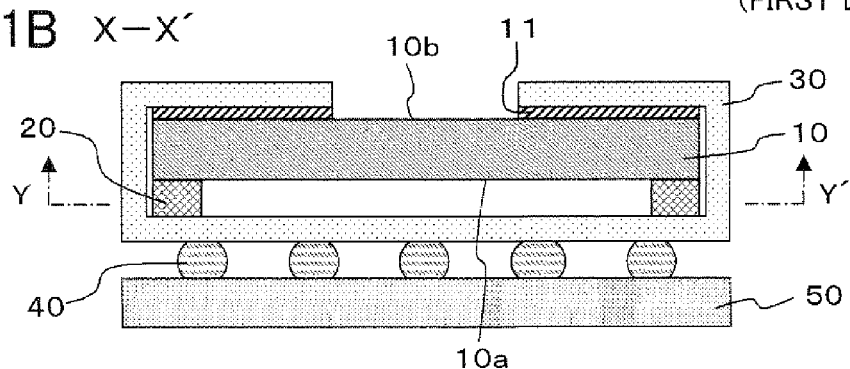
FIG. 1C  Y-Y' (FIRST EXAMPLE)
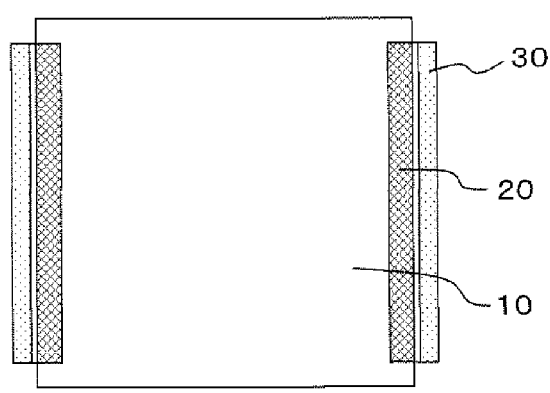

(FIRST EXAMPLE)

FIG. 3A (FIRST EXAMPLE)
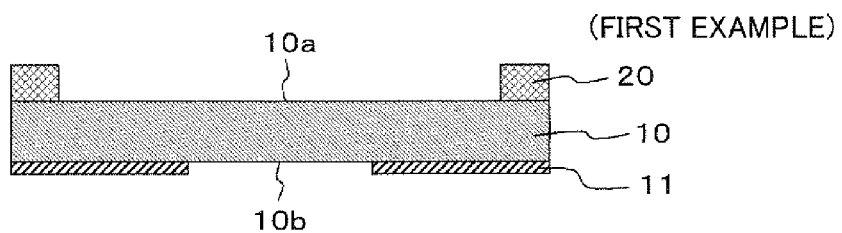
FIG. 3B (FIRST EXAMPLE)
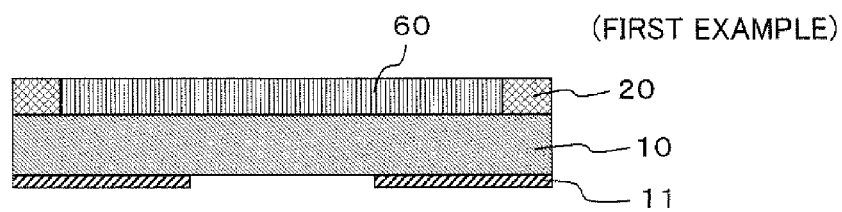
FIG. 3C (FIRST EXAMPLE)
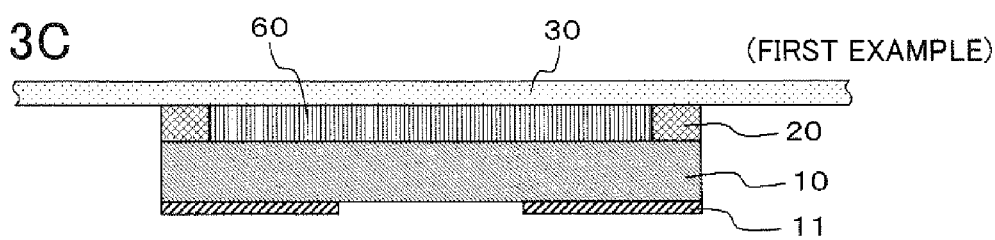
FIG. 3D (FIRST EXAMPLE)
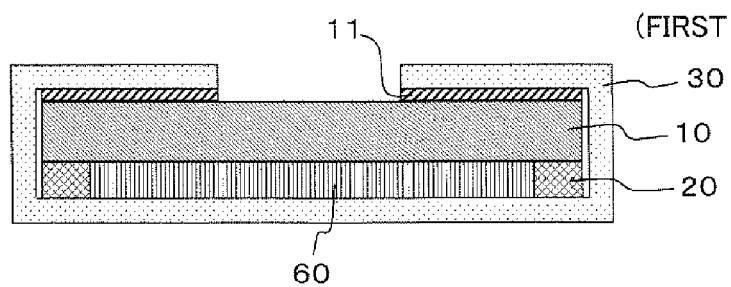
FIG. 3E (FIRST EXAMPLE)
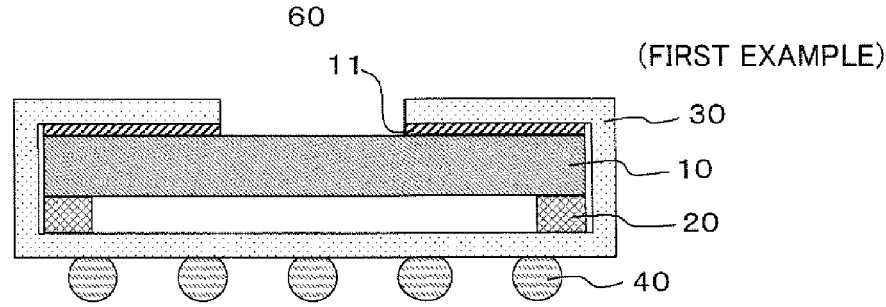

FIG. 4 (FIRST EXAMPLE)
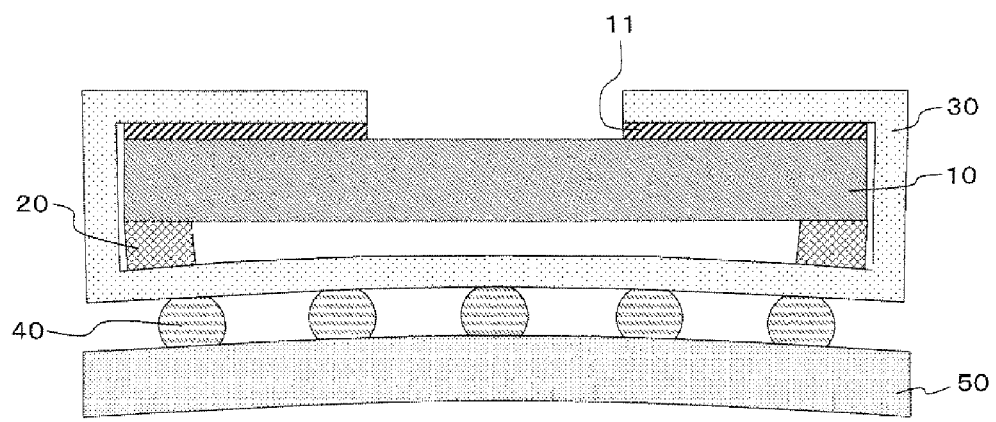
FIG. 5 (FIRST EXAMPLE)
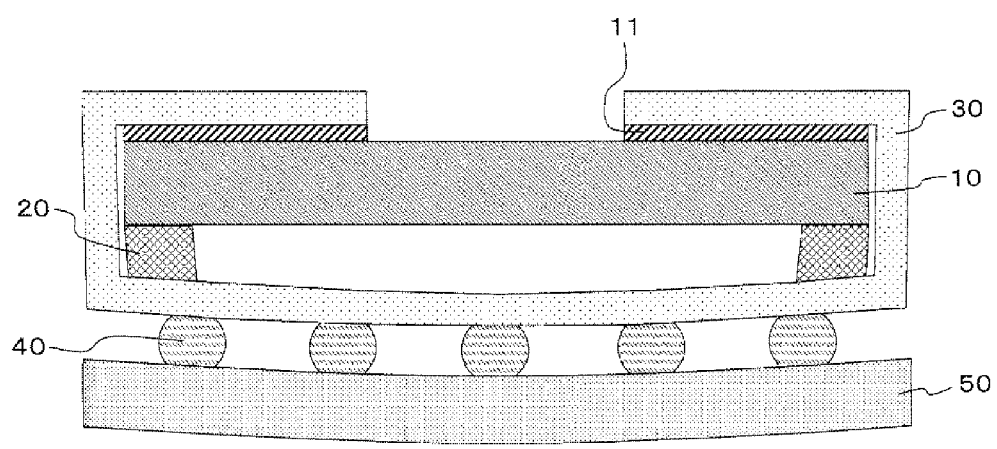

(FIRST EXAMPLE)

FIG. 7A (SECOND EXAMPLE)
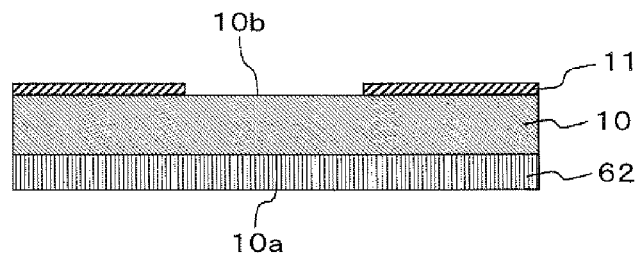
FIG. 7B (SECOND EXAMPLE)
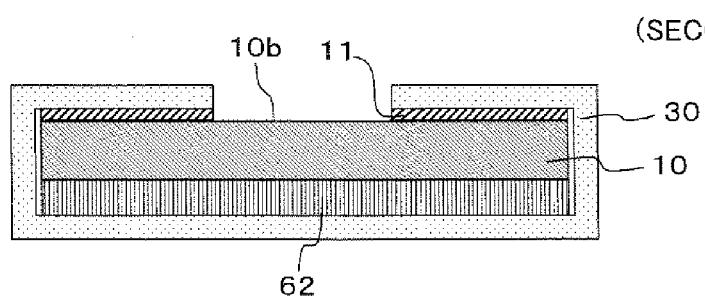
FIG. 7C (SECOND EXAMPLE)
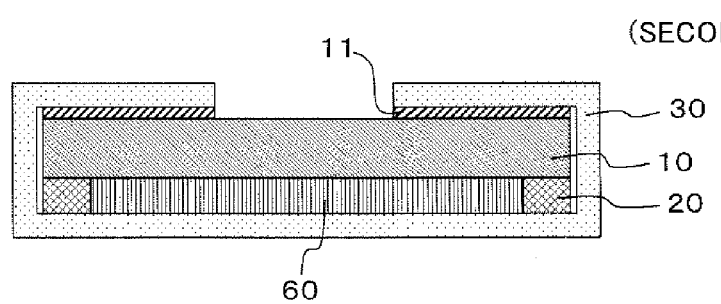
FIG. 7D (SECOND EXAMPLE)
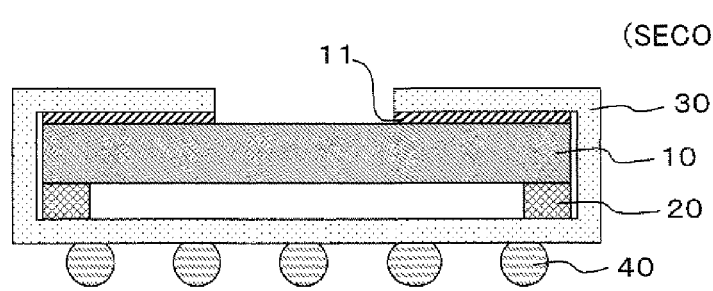

(FOURTH EXAMPLE)

FIG. 9A (FOURTH EXAMPLE)
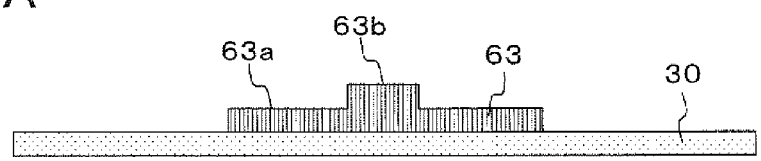
FIG. 9B (FOURTH EXAMPLE)
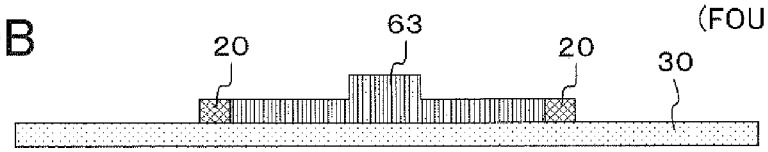
FIG. 9C (FOURTH EXAMPLE)
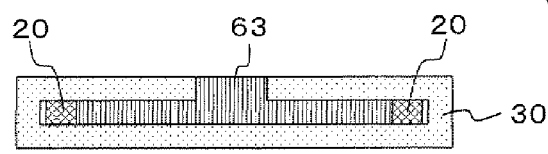
FIG. 9D (FOURTH EXAMPLE)
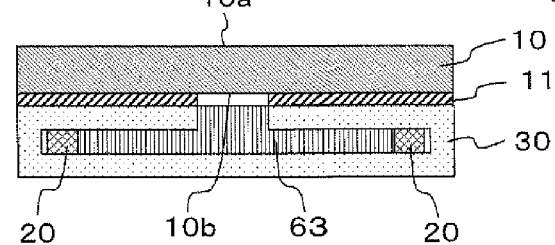
FIG. 9E (FOURTH EXAMPLE)
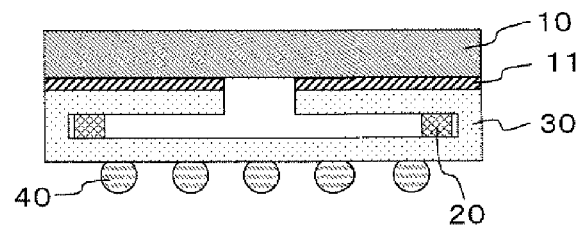

FIG. 10　　　　　　　　　　　　　　　　　　(FOURTH EXAMPLE)
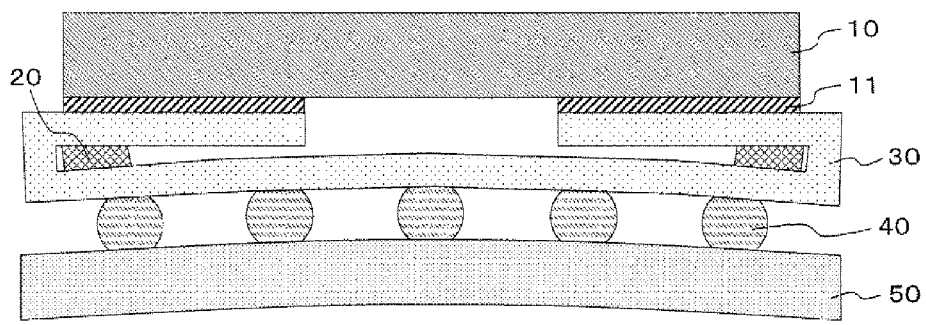
FIG. 11　　　　　　　　　　　　　　　　　　(FOURTH EXAMPLE)
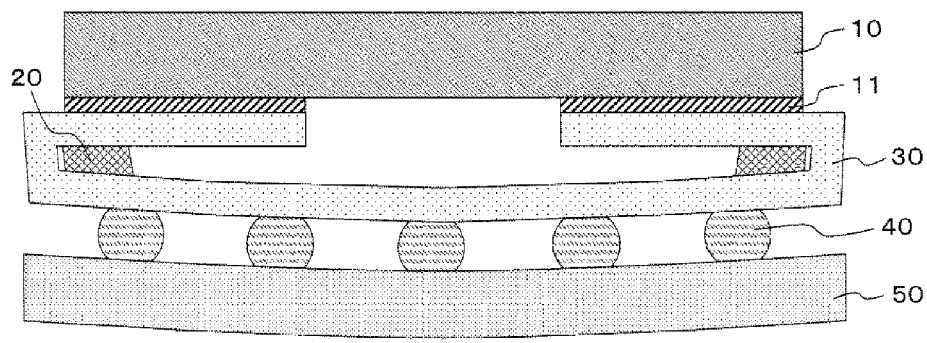

FIG. 12 (FOURTH EXAMPLE)
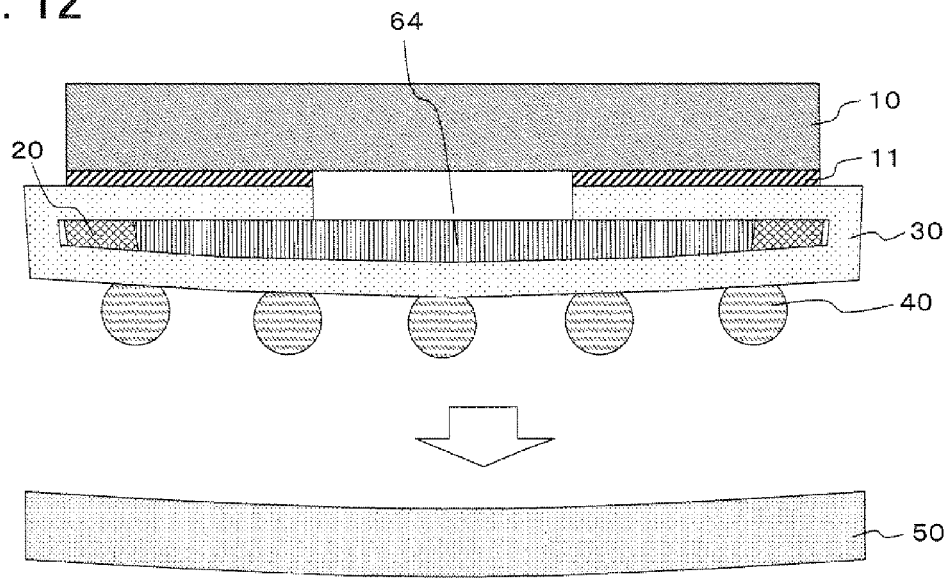
FIG. 13 (FIFTH EXAMPLE)
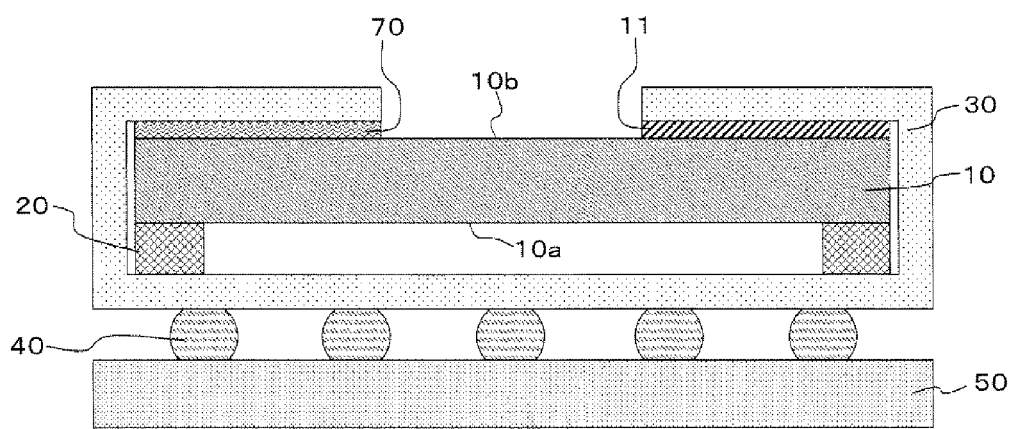

(FIFTH EXAMPLE)

(FIFTH EXAMPLE)

(FIFTH EXAMPLE)

(FIFTH EXAMPLE)

FIG. 15 (SIXTH EXAMPLE)
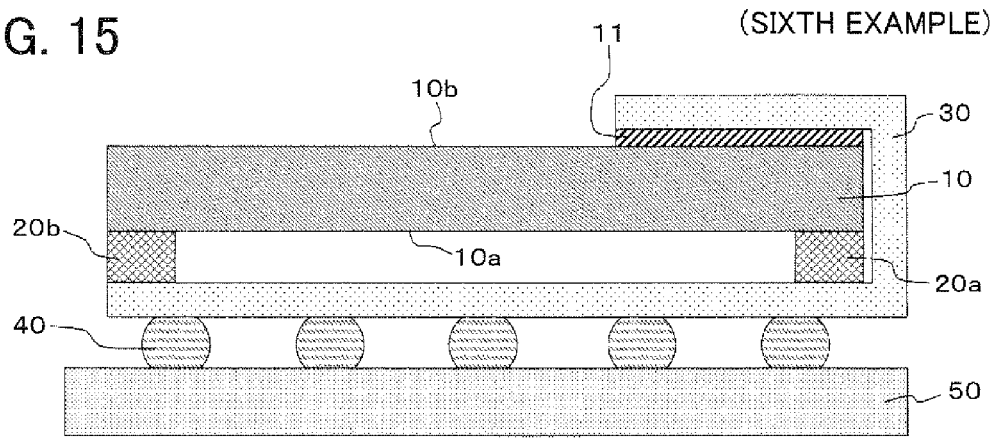
FIG. 16 (SEVENTH EXAMPLE)
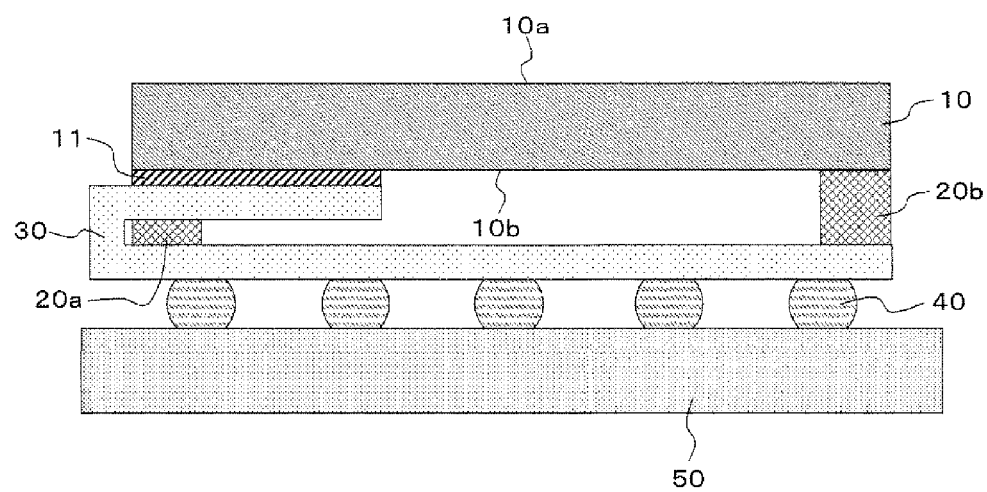

FIG. 17A (SEVENTH EXAMPLE)
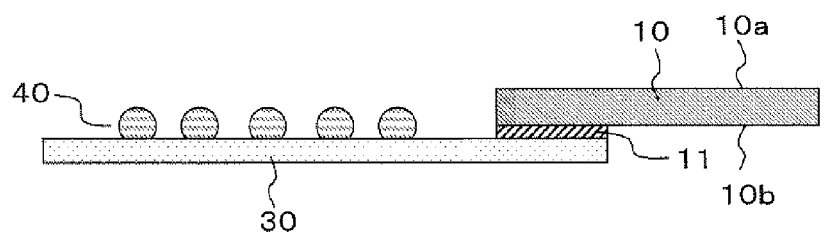
FIG. 17B (SEVENTH EXAMPLE)
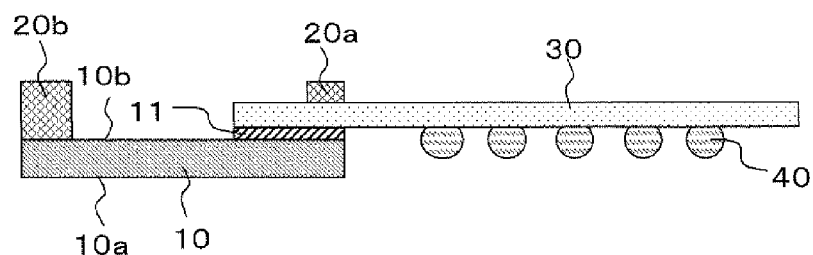
FIG. 17C (SEVENTH EXAMPLE)
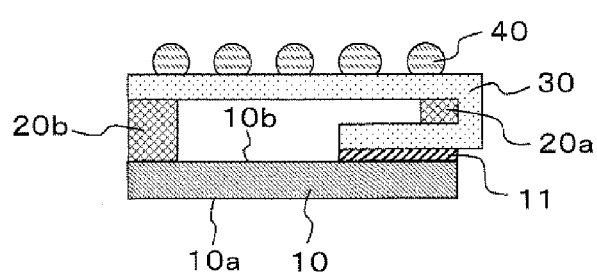

FIG. 18A (EIGHTH EXAMPLE)
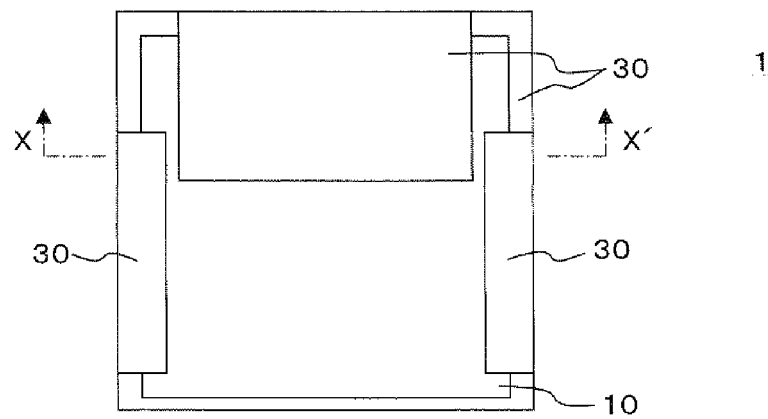
FIG. 18B (EIGHTH EXAMPLE)
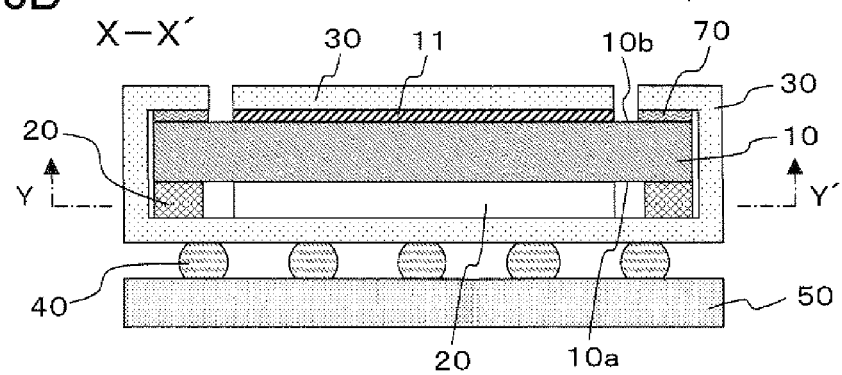
FIG. 18C (EIGHTH EXAMPLE)
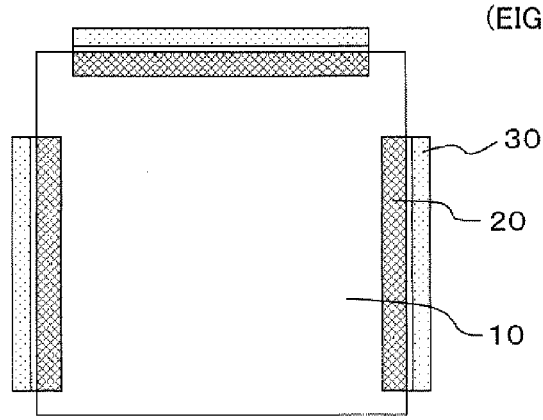

FIG. 19A (NINTH EXAMPLE)
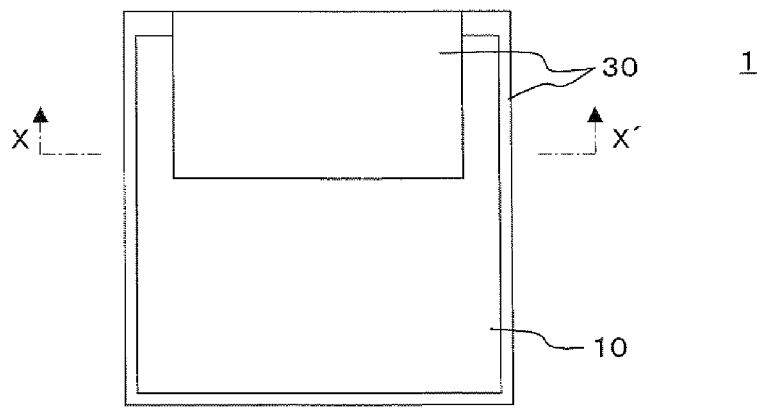
FIG. 19B (NINTH EXAMPLE)
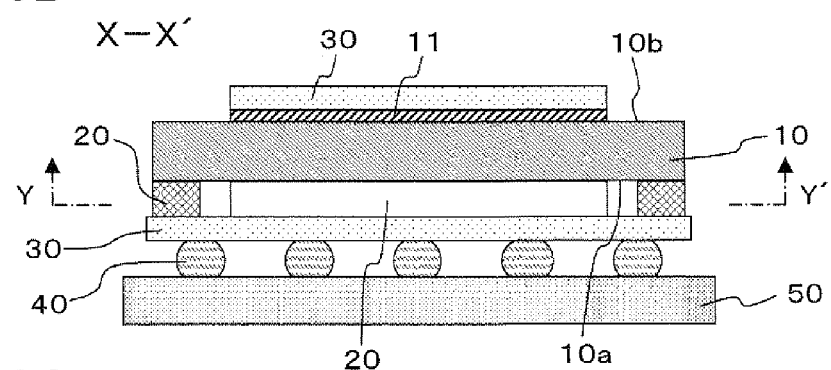
FIG. 19C
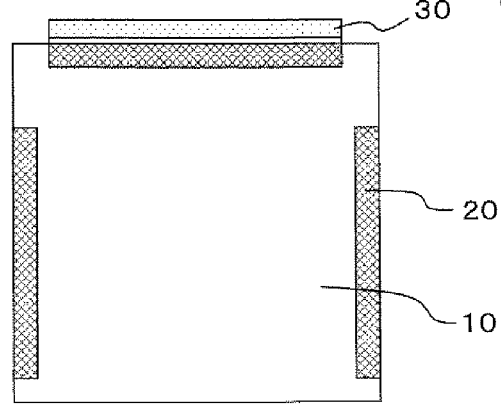

FIG. 20A (TENTH EXAMPLE)
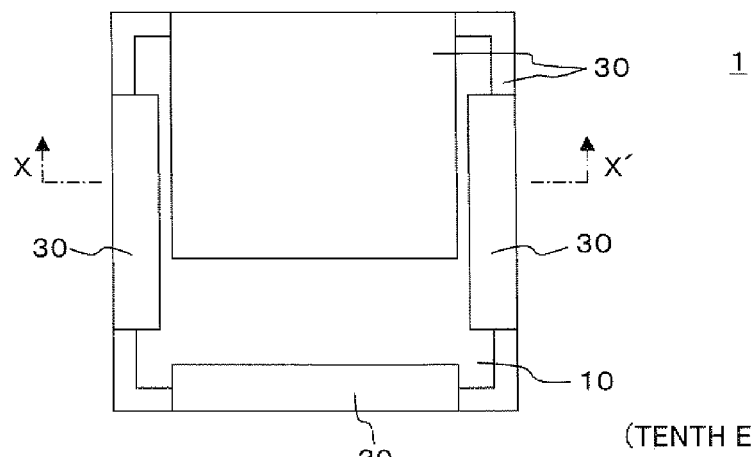
FIG. 20B (TENTH EXAMPLE)
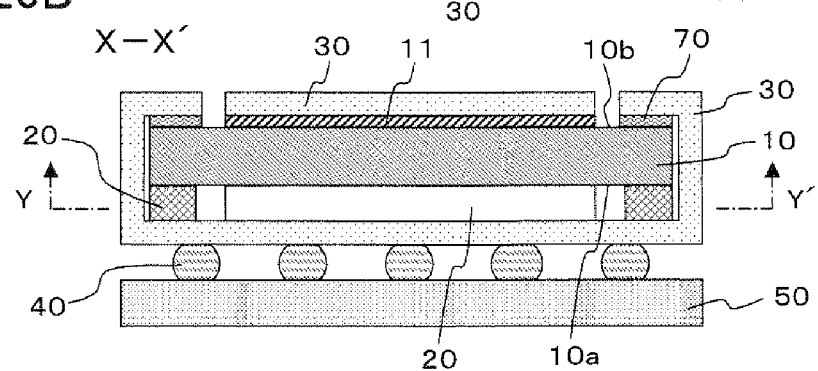
FIG. 20C
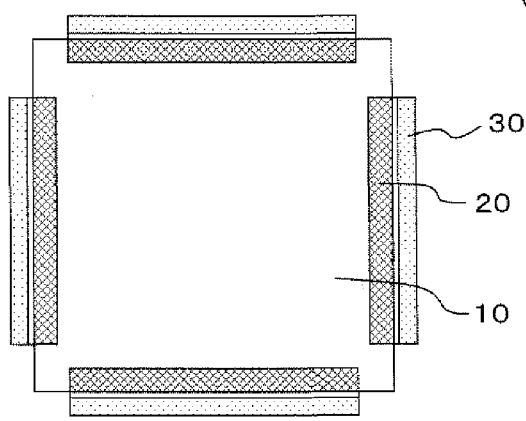

SEMICONDUCTOR PACKAGE, ELECTRONIC PART AND ELECTRONIC DEVICE

TECHNICAL FIELD

This invention relates to a semiconductor package on which a semiconductor part has been mounted, an electronic part and an electronic device. More particularly, the invention relates to a semiconductor package suited to an electronic device the external appearance of which is curved, an electronic part and an electronic device.

BACKGROUND ART

Recent electronic devices tend to be lighter, thinner and smaller, and parts in which emphasis is placed on design and that make frequent use of curved surfaces for external appearance have begun to appear on the market. Further, parts with a curved-surface design have been announced in the form of various electronic devices as concept models.

In order to realize lighter, thinner and smaller models the external appearance of which presents a curved surface, it is preferred that internal parts be mounted even on the curved portions, a goal which is not feasible with the packaging of the conventional art. Preferably, the mounting substrate is provided with a curved surface to assure space.

Conventional art examples of a semiconductor package on which a semiconductor device has been mounted will be described.

FIG. 21 is a sectional view schematically illustrating the structure of a semiconductor package according to a first example of the conventional art. The first example of the conventional art is an ordinary ball grid array electronic part (referred to as a "BGA-type electronic part) according to the conventional art, as illustrated in Patent Document 1. As shown in FIG. 21, a conventional BGA-type electronic part 100 includes a planar base substrate 101; an accommodating portion 102 comprising a mold formed on one face of the base substrate 101; an IC chip 103, which is a semiconductor element placed in the accommodating portion 102; and solder balls 104 of radius r provided on the other face of the base substrate 101 and connected by wires or the like to terminals of the IC chip 103. The connection between the BGA-type electronic part 100 and a mounting substrate (not shown) is achieved by placing the BGA-type electronic part 100 on the mounting substrate, then applying heat through a reflow oven and melting the solder balls 104 to connect the BGA-type electronic part 100 to the mounting substrate.

FIG. 22 is a sectional view schematically illustrating the structure of a semiconductor package according to a second example of the conventional art. The second example of the conventional art is similar to a conventional chip-size package described in Patent Document 2. In a semiconductor package 200 shown in FIG. 22, the electrode (not shown) of a semiconductor chip 201 is connected by a conductor 203 to an electrode pad 202c of an interposer 202 obtained by building up insulating films 202b on both sides of a wiring pattern 202a. Thereafter, an insulating resin 204 is injected into the space between the interposer 202 and semiconductor chip 201, the interposer 202 is bent from the side surface of the semiconductor chip 201 to the back surface (the surface on the side opposite that on which the electrode pad is disposed), and the insulating resin 204 is applied to the area in which the semiconductor chip 201 is exposed at the back side of the chip 201, thereby adhering the interposer 202 to the semiconductor chip 201. Solder bumps 205 are formed on electrode pads 202d of the interposer 202. In this semiconductor chip 201, the interposer 202 and semiconductor chip 201 are adhered by the insulating resin 204, which performs the role of an adhesive.

[Patent Document 1] Japanese Patent Kokai Publication No. JP-A-9-167811

[Patent Document 2] Japanese Patent Kokai Publication No. JP-A-8-335663

DISCLOSURE OF THE INVENTION

Problems to be Solved by the Invention

However, according to the structure of this conventional semiconductor package, it is conceivable that various problems will arise in a case where the substrate on which the semiconductor package has been mounted is made to curve. For example, with the structures of the semiconductor packages according to the first and second examples of the conventional art, the problems set forth below arise when the substrate is made a curved substrate.

A problem relating to the first example of the conventional art is that since the IC chip 103 and accommodating portion 102 are completely affixed to the base substrate 101, when the mounting substrate is caused to curve, the base substrate 101 and IC chip 103 cannot completely follow up such bending. When the mounting substrate is caused to curve, therefore, faulty connection due to cracking occurs in the IC chip 103 and at the joints with the solder balls 104.

A problem relating to the second example of the conventional art is that since the interposer 102 is adhered to the semiconductor chip 201 by the insulating resin 204, when the mounting substrate is caused to curve, the interposer 202 and semiconductor chip 201 cannot completely follow up such bending, in a manner similar to that of the first example of the conventional art. Consequently, faulty connection due to cracking occurs in the semiconductor chip 201 and at the joints between the solder balls 205 and electrode pads 202d.

A primary object of the present invention is to mitigate stress upon electrical connections even when a substrate on which a semiconductor package has been mounted is made curved, thereby eliminating faulty connections and improving connection reliability.

Means to Solve the Problems

In a first aspect of the present invention, a semiconductor package is characterized by comprising: a semiconductor part having an electrode on one face thereof, a bendable and flexible support block disposed at least at two locations on a peripheral edge of the semiconductor part on the other face thereof; and an interposer bridging the support blocks with the support blocks being situated between the interposer and the semiconductor part, and having a wiring pattern in a flexible resin film, the wiring pattern being electrically connected to the electrode of the semiconductor part.

In a second aspect of the present invention, a semiconductor package is characterized by comprising: a semiconductor part having an electrode on one face thereof; an interposer having a wiring pattern in a flexible resin film, the interposer having at least one end folded back onto the side of the semiconductor part and the wiring pattern being electrically connected to the electrode of the semiconductor part; and a bendable and flexible support block disposed inside the interposer in the vicinity of the folded-back portion of the interposer.

MERITORIOUS EFFECTS OF THE INVENTION

In accordance with the present invention (claims 1 to 24), when a substrate on which a semiconductor package has been mounted is made curved, an interposer is capable of curving since the interposer is flexible and is supported on support blocks. Stress that accompanies such curving is capable of being absorbed owing to the fact that the support blocks follow up bending and flexing. As a result, stress does not act upon the semiconductor part. Further, even if the semiconductor package is made curved, stress upon the connections between the semiconductor part and the substrate is mitigated, thereby improving reliability owing to eliminated faulty connections.

BRIEF DESCRIPTION OF THE DRAWINGS

FIG. 1A is a plan view schematically illustrating the structure of a semiconductor package according to a first example of the present invention, 1B an enlarged sectional view taken along line X-X' and 1C a sectional view taken along line Y-Y';

FIGS. 3A to 3E are process sectional views schematically illustrating a method of manufacturing the semiconductor package according to the first example of the present invention;

FIG. 4 is a side view schematically illustrating an example of a state in which the semiconductor package according to the first example of the present invention is curved into a convex shape;

FIG. 5 is a side view schematically illustrating an example of a state in which the semiconductor package according to the first example of the present invention is curved into a concave shape;

FIGS. 7A to 7D are process sectional views schematically illustrating a method of manufacturing a semiconductor package according to a second example of the present invention;

FIGS. 9A to 9E are process sectional views schematically illustrating a method of manufacturing the semiconductor package according to the fourth example of the present invention;

FIG. 10 is a side view schematically illustrating an example of a state in which the semiconductor package according to the fourth example of the present invention is curved into a convex shape;

FIG. 11 is a side view schematically illustrating an example of a state in which the semiconductor package according to the fourth example of the present invention is curved into a concave shape;

FIG. 12 is a sectional view schematically illustrating one process step in a case where the semiconductor package according to the fourth example of the present invention is connected to a substrate that has been bent into a concave shape in advance;

FIG. 13 is a sectional view schematically illustrating the structure of a semiconductor package according to a fifth example of the present invention;

FIG. 15 is a sectional view schematically illustrating the structure of a semiconductor package according to a sixth example of the present invention;

FIG. 16 is a sectional view schematically illustrating the structure of a semiconductor package according to a seventh example of the present invention;

FIGS. 17A to 17C are process sectional views schematically illustrating a method of manufacturing the semiconductor package according to the seventh example of the present invention;

FIG. 18A is a plan view schematically illustrating the structure of a semiconductor package according to an eighth example of the present inventions 18B an enlarged sectional view taken along line X-X' and 18C a sectional view taken along line Y-Y';

FIG. 19A is a plan view schematically illustrating the structure of a semiconductor package according to a ninth example of the present invention, 19B an enlarged sectional view taken along line X-X' and 19C a sectional view taken along line Y-Y';

FIG. 20A is a plan view schematically illustrating the structure of a semiconductor package according to a tenth example of the present invention, 20B an enlarged sectional view taken along line X-X' and 20C a sectional view taken along line Y-Y';

EXPLANATION OF REFERENCE NUMERALS

Figure 2:
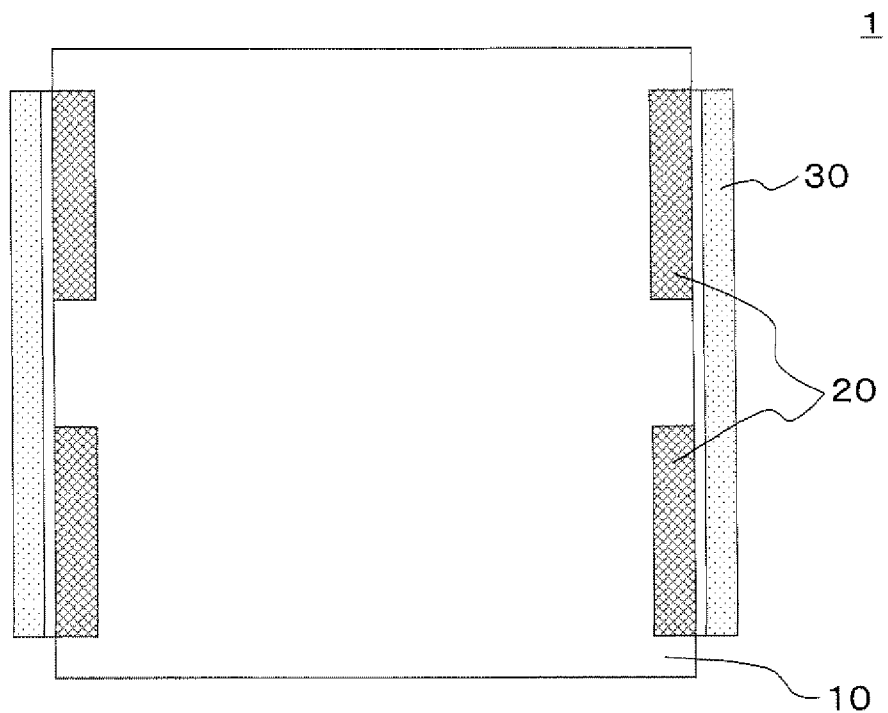
FIG. 2 is a modification of the sectional view taken along line Y-Y' of FIG. 1B schematically illustrating the structure of the semiconductor package according to the first example of the present invention.

1 semiconductor package
10 semiconductor chip
10a first face
10b second face
11 electrode
20, 20a, 20b support block
30 interposer
40 solder ball
50 substrate
60, 62 spacer
61, 64 curved spacer
63 spacer
63a first face
63b second face
70 adhesive
100 BGA-type electronic part
101 base substrate
102 accommodating portion
103 IC chip
104 solder ball
200 semiconductor package
201 semiconductor chip
202 interposer
202a wiring pattern
202b insulating film
202c electrode pad 202d electrode pad
203 conductor
204 insulating resin
205 solder bump

PREFERRED MODES FOR CARRYING OUT
THE INVENTION

First Example

A semiconductor package according to a first example of the present invention will be described with reference to the drawings. FIG. 1A is a plan view schematically illustrating the structure of a semiconductor package according to a first example of the present invention, FIG. 1B an enlarged sectional view taken along line X-X' and FIG. 1C a sectional view taken along line Y-Y'. FIG. 2 is a modification of the sectional view taken along line Y-Y' of FIG. 1B schematically illustrating the structure of the semiconductor package according to the first example of the present invention.

A semiconductor package 1 according to the first example has a semiconductor chip 10, support blocks 20, an interposer 30 and solder balls 40.

The semiconductor chip 10 has electrodes 11 disposed on the peripheral edge of a second face 10b thereof. As shown in FIG. 1B, the semiconductor chip 10 has the electrodes 11 disposed on the second face 10b in the vicinity of a pair of opposing sides thereof. An IC chip can be used as the semiconductor chip 10, by way of example.

The support block 20 is adhered to a peripheral edge of a first face 10a of the semiconductor chip 10 so as to lie parallel to the direction of arrangement of the electrodes 11 placed on the second face 10b of the semiconductor chip 10. The support blocks 20 are placed at least at two locations. For example, as shown in FIG. 1C, two of the support blocks 20 are disposed in the vicinity of the pair of opposing sides. In FIG. 2, four of the support blocks 20 are disposed by dividing the support block on each side into two portions. Between the support blocks 20 there is a space, the space being between the semiconductor chip 10 and the interposer 30. With regard to the size of the support block 20, assume that the lateral direction, depth direction and vertical direction in FIG. 1B are the directions of width, length and thickness, respectively. Preferably, the width is less than one-fourth the length of the side of the semiconductor chip 10 in order to facilitate elastic deformation on the inner side, the length is equivalent to the range along which the solder balls 40 are mounted on the interposer 30 in the depth direction in order to uniformly mitigate stress that acts upon the solder balls 40, and the thickness, which can be varied in accordance with the curvature of a substrate 50, is made a height such that the first face 10a of the semiconductor chip 10 will not be contacted when the interposer 30 is made to curve. A resilient material that is capable of following up bending and flexing of the substrate 50 due to the curving thereof is used as the support block 20. For example, use of a rubber-like material having a hardness of less than 60° is preferred, and hard silicon rubber, nitrite rubber and fluororubber can be used.

The interposer 30 comprises a three-layer structure in which a wiring pattern is disposed between two layers of flexible resin film (not shown). The interposer 30 is placed so as to cover the outer periphery of the semiconductor chip 10. The interposer 30 bridges the support blocks 20 on the side of the first face 10a of semiconductor chip 10 via the intermediary of the support blocks 20, and is folded back from the side of the first face 10a of semiconductor chip 10 onto the second face 10b of semiconductor chip 10 on the outer side of the support blocks 20. The wiring pattern (not shown) of the interposer 30 is electrically connected to the corresponding electrodes 11 on the side of the second face 10b of semiconductor chip 10. The solder balls 40 for electrical connection to electrodes (not shown) of the substrate 50 are disposed on the surface of the interposer 30 on the side facing the substrate 50. With regard to the size of the interposer 30, assume that the vertical direction and lateral direction in FIG. 1A are the directions of length and width, respectively. Preferably, the length is equivalent to that of the support block 20 in order that stress will act upon the support block 20 as uniformly as possible at the time of the curving operation. The width of the fold of the interposer 30 is determined from the required area of the electrode 11 and the length. Since the strength of the connection to the electrode 11 is required to withstand a tensile force when the interposer is made to curve, lateral uniformity is desirable for the folded portions. If necessary, the folded portions may be lengthened to up to one-half the width of the semiconductor chip 10 to cover the entirety of the second face 10b of semiconductor chip 10.

It should be noted that the substrate 50 is a circuit board having electrodes (not shown) at positions corresponding to respective ones of the solder balls 40.

Next, a method of manufacturing the semiconductor package according to the first example will be described with reference to the drawings. FIGS. 3A to 3E are process sectional views schematically illustrating a method of manufacturing the semiconductor package according to the first example of the present invention.

First, the first face 10a of the semiconductor chip 10 is faced upward and the support blocks 20 are adhesively secured to prescribed positions of the peripheral edge portions of the first face 10a of semiconductor chip 10 [see FIG. 3A]. Next, a sufficiently rigid spacer 60 having a thickness the same as that of the support blocks 20 is placed between the support blocks 20 [see FIG. 3B].

Next, the interposer 30 is registered with prescribed positions on the support blocks 20 and the interposer 30 and support blocks 20 are adhesively secured [see FIG. 3C]. Thereafter, the second face 10b of semiconductor chip 10 is faced upward, both end portions of the interposer 30 are folded back onto the second face 10b of semiconductor chip 10, the electrode 11 of the semiconductor chip 10 and an electrode pad (not shown) on the inner peripheral side of the interposer 30 are positioned at prescribed positions and these are connected by a thermo-compression bonding method [see FIG. 3D]. Here the force that acts upon the semiconductor chip 10 at the time of thermo-compression bonding is received by the spacer 60. This is followed by mounting the solder balls 40 on electrodes (not shown) on the outer peripheral side of the interposer 30, after which the spacer 60 is removed [see FIG. 3E]. The resulting semiconductor package 1 is then mounted on the substrate 50, as illustrated in FIG. 1B).

Next, a case where the substrate on which the semiconductor package according to the first example has been mounted is made to curve will be described with reference to the drawings. FIG. 4 is a side view schematically illustrating an example of a state in which the semiconductor package according to the first example of the present invention is curved into a convex shape. FIG. 5 is a side view schematically illustrating an example of a state in which the semiconductor package according to the first example of the present invention is curved into a concave shape.

If the substrate 50 is bent two-dimensionally into a convex shape with the center of the support blocks 20 in the lateral direction in FIG. 1B serving as the apex, the interposer 30 is urged upward via the solder balls 40 (see FIG. 4). Thus, since it is possible for the support blocks 20 to follow up the bending and flexing of the substrate 50 caused by the curving thereof, the stress at the solder balls 40 is alleviated and problems such as faulty connections no longer occur.

Further, if the substrate 50 is bent two-dimensionally into a concave shape with the center of the support blocks 20 in the lateral direction in FIG. 1B serving as the apex, the interposer 30 is urged downward via the solder balls 40 (see FIG. 5). Thus, since it is possible for the support blocks 20 to follow up the bending and flexing of the substrate 50 caused by the curving thereof, the stress at the solder balls 40 is alleviated and problems such as faulty connections no longer occur.

If the support blocks 20 are used at two or more locations on one side and are spaced away from each other, as illustrated in FIG. 2, the support blocks 20 more easily follow up bending and flexing ascribable to curving and this has the effect of mitigating stress upon the solder balls 40.

Figure 6:
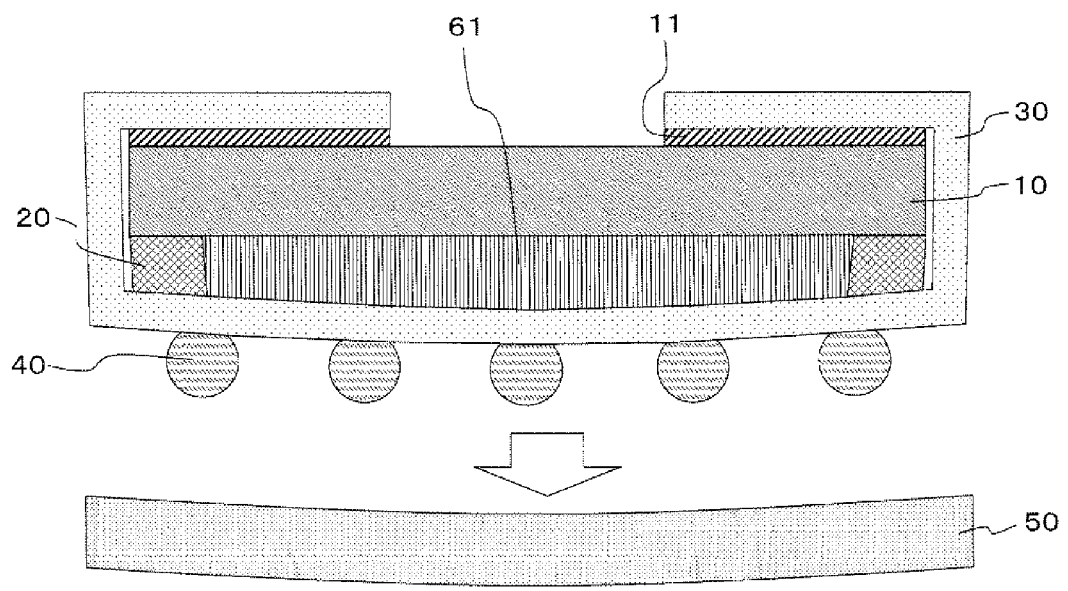
FIG. 6 is a sectional view schematically illustrating one process step in a case where the semiconductor package according to the first example of the present invention is connected to a substrate that has been bent into a concave shape in advance.

Next, a case where the semiconductor package according to the first example of the present invention is connected to a substrate that has been bent into concave and convex shapes in advance will be described with reference to the drawings. FIG. 6 is a sectional view schematically illustrating one process step in a case where the semiconductor package according to the first example of the present invention is connected to a substrate that has been bent into a concave shape in advance.

The support blocks 20 are capable of following up bending and flexing in a manner similar to the case where the semiconductor package is mounted on the convexly curved substrate while being subjected to pressure, whereby the substrate on which the semiconductor package has been mounted is made to curve, as illustrated in FIG. 5. As a result, stress at the solder balls 40 is mitigated and problems such as faulty connections no longer occur.

By preparing a curved spacer 61, which conforms to the curvature of the substrate 50 curved in advance, for the concavely curved substrate 50, inserting the curved spacer 61 between the support blocks 20 to thereby resiliently deform the support blocks 20 and cause the interposer 30 to conform to the curvature of the substrate 50, as illustrated in FIG. 6, and then connecting the two, it is possible for the stress acting upon the interposer 30 to be absorbed and for bending to be achieved in a manner similar to the case where the substrate on which the semiconductor package has been mounted is made to curve. In this case, the curved spacer 61 is removed after the semiconductor package is connected to the substrate 50.

In accordance with the first example, when the substrate 50 on which the semiconductor package 1 has been mounted is made to curve, or when the semiconductor package 1 is mounted on the substrate 50 that has been curved in advance, the interposer 30 absorbs the bending and flexing ascribable to curving of the substrate between the support blocks 20, thereby making possible deformation at the time the substrate is made curved.

Second Example

A semiconductor package according to a second example of the present invention will be described with reference to the drawings. FIG. 7 is a process sectional view schematically illustrating a method of manufacturing a semiconductor package according to a second example of the present invention.

Although the semiconductor package according to the second example has a structure similar to that of the first example, the support blocks 20 are not adhesively secured to either the semiconductor chip 10 or interposer 30. The semiconductor package according to the second example is manufactured by the manufacturing method illustrated below.

First, a sufficiently rigid spacer 62 having a thickness identical with that of the support blocks 20 and a size identical with that of the semiconductor chip is placed on the first face 10a of the semiconductor chip 10 [see FIG. 7A]. Next, the interposer 30 is registered with a prescribed position on the spacer 62, both end portions of the interposer 30 are folded back onto the second face 10b of semiconductor chip 10, the electrode 11 of the semiconductor chip 10 and an electrode pad (not shown) on the inner peripheral side of the interposer 30 are positioned at prescribed positions and these are connected by a thermo-compression bonding method [see FIG. 7B]. It should be noted that the force acting upon the semiconductor chip 10 at the time of thermo-compression bonding is received by the spacer 62.

Next, the spacer 62 is removed, the spacer 60 similar to that of the first example is placed between the semiconductor chip 10 and the interposer 30, and then the support blocks 20 are placed between the semiconductor chip 10 and the interposer 30 [FIG. 7C]. When this is done, the support blocks 20 are not adhesively secured. Thereafter, with the spacer 60 left in place, the solder balls 40 are mounted, after which the spacer 60 is removed [see FIG. 7D]. The resulting semiconductor package is then mounted on a substrate.

It should be noted that the teachings of the first example can be applied to the width, length and material of the support blocks 20 and to the width and length of the interposer 30. Further, if the thickness of the support blocks 20 is made amount 5% larger than the original spacing between the semiconductor chip 10 and interposer 30, the support blocks 20 will not fall out as they will be sandwiched and compressed between the semiconductor chip 10 and interposer 30.

In accordance with the second example, the semiconductor package is capable of being curved in a manner similar to that of the first example. However, an advantage of the second example is that the step of adhering the support blocks 20 can be eliminated.

Third Example

A semiconductor package according to a third example of the present invention will be described.

Although the semiconductor package according to the third example has a structure similar to those of the first and second examples, the support blocks are formed from a thermoplastic resin that softens at a temperature below that at which the solder balls melt. The method of manufacturing the semiconductor package according to the third example is similar to those of the first and second examples. It should be noted that when the substrate 50 is bent at the center two-dimensionally into the concave and convex shapes in parallel with the longitudinal direction of the support blocks 20, as illustrated in FIGS. 4 and 5, it is preferred that this be performed in an environment in which the temperature is below that at which the solder balls 40 melt in order to mitigate the internal stress of the substrate 50. If curving is performed at such an environmental temperature, the support blocks 20 bend inward owing to their softening and absorb the stress that acts upon the interposer 30. When temperature returns to room temperature after the curving operation, the support blocks 20 harden again while remaining in the inwardly bent state. This is advantageous in that the restoration force of the support blocks 20 will not act upon the interposer 30 following the curving operation.

Fourth Example

Figure 8:
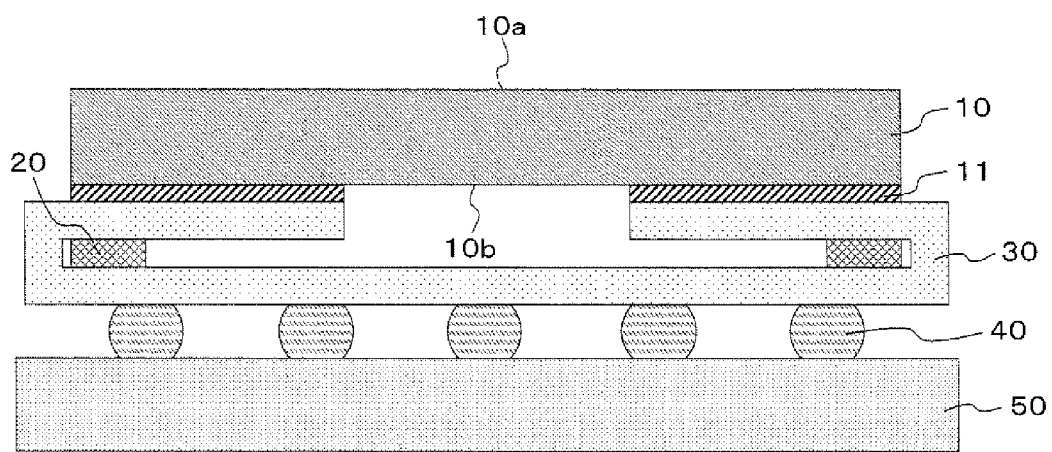
FIG. 8 is a sectional view schematically illustrating the structure of a semiconductor package according to a fourth example of the present invention.

A semiconductor package according to a fourth example of the present invention will be described with reference to the drawings. FIG. 8 is a sectional view schematically illustrating the structure of a semiconductor package according to a fourth example of the present invention.

The semiconductor package 1 according to the fourth example differs from the first to third examples in that the semiconductor chip 10 is mounted on the interposer 30 without the outer periphery of the semiconductor chip 10 being covered and in that only the support blocks 20 are placed on the inner side of the folded portions of the interposer 30.

The semiconductor chip 10 is such that the electrode 11 disposed on the second face 10b is placed on the side facing the substrate 50. The support blocks 20 do not abut against the semiconductor chip 10 but at least the upper and lower surfaces thereof abut against the interposer 30. The solder balls 40 are disposed on the side of the interposer 30 facing the substrate 50 in order to achieve electrical connection. A wiring pattern (not shown) of the interposer 30 is electrically connected to the electrodes 11 of the semiconductor chip 10 that have been mounted on both folded ends of the interposer. There is a space between the semiconductor chip 10 and interposer 30 in the vicinity of the support blocks 20. Other structural elements are similar to those of the first to third examples.

A method of manufacturing the semiconductor package according to the fourth example will be described next with reference to the drawings. FIGS. 9A to 9E are process sectional views schematically illustrating a method of manufacturing the semiconductor package according to the fourth example of the present invention.

First, a spacer 63 is placed on a side (upper side) of the interposer 30 opposite that on which the solder balls 40 are mounted [FIG. 9A]. The spacer 63 is provided with steps. The height from the surface of the interposer 30 on which the spacer 63 is placed to a first face 63a of the spacer 63 is the same as the height of the support blocks 20, and the height from the surface of the interposer 30 on which the spacer 63 is placed to a second face 63b of the spacer 63 is the same as the distance from the side of the interposer 30 opposite that on which the solder balls 40 are mounted to the second face 10b of the semiconductor chip 10. Further, the width of the upper step of the spacer 63 is such that when the leading ends of the folded-back portions of the interposer 30 are abutted against the spacer, the pitch of the electrode pads (not shown) on the interposer 30 and that of the electrodes 11 of the semiconductor chip 10 in the direction perpendicular to the abutting surfaces will coincide. It should be noted that the placement of the spacer 63 is accomplished by providing the placement surface of the interposer 30 with a positioning line as by silk printing and using the line as a guiding mark.

Next, the support blocks 20 are placed at both edge portions of the spacer 63 on the interposer 30 [see FIG. 9B]. When this is done, it is so arranged that the support blocks 20 abut lightly against the end faces of the spacer 63. It is preferred that the support blocks 20 and interposer 30 be adhesively secured at this time.

Next, both ends of the interposer 30 are folded twice on the outer sides of the support blocks 20 so as to embrace the support blocks 20, and the leading ends of the folded interposer 30 are abutted against the stepped face of the spacer 63 to achieve positioning [see FIG. 9C]. It should be noted that in a case where the width of the folded portions of the interposer 30 is one-half the lateral width of the semiconductor chip 10, the spacer 63 need not be provided with steps and positioning will be possible by abutting the leading ends of the folded portions of the interposer 30 against each other.

Next, with the electrode(s) 11 of the semiconductor chip 10 faced toward the side of the interposer 30, the semiconductor chip 10 is registered with a prescribed position on the interposer 30, after which the two are connected by thermo-compression bonding [see FIG. 9D]. The force that acts upon the semiconductor chip 10 at the time of thermo-compression bonding is received by the spacer 63. This is followed by mounting the solder balls 40 on electrodes (not shown) on the outer peripheral side of the interposer 30, after which the spacer 63 is removed [see FIG. 9E]. The resulting semiconductor package is then mounted on the substrate 50, as illustrated in FIG. 8.

Next, a case where the substrate on which the semiconductor package according to the fourth example has been mounted is made to curve will be described with reference to the drawings. FIG. 10 is a side view schematically illustrating an example of a state in which the semiconductor package according to the fourth example of the present invention is curved into a convex shape. FIG. 11 is a side view schematically illustrating an example of a state in which the semiconductor package according to the fourth example of the present invention is curved into a concave shape.

If the substrate 50 is bent two-dimensionally into a convex shape with the center of the support blocks 20 in the lateral direction in FIG. 8 serving as the apex, the interposer 30 is urged upward via the solder balls 40. However, since it is possible for the support blocks 20 to follow up the bending and flexing of the substrate 50 caused by the curving thereof, as illustrated in FIG. 10, the stress at the solder balls 40 is alleviated and problems such as faulty connections no longer occur.

Further, if the substrate 50 is bent two-dimensionally into a concave shape with the center of the support blocks 20 in the lateral direction in FIG. 8 serving as the apex, the interposer 30 is urged downward via the solder balls 40. However, since it is possible for the support blocks 20 to follow up the bending and flexing of the substrate 50 caused by the curving thereof, as illustrated in FIG. 11, the stress at the solder balls 40 is alleviated and problems such as faulty connections no longer occur.

Next, a case where the semiconductor package according to the fourth example of the present invention is connected to a substrate that has been bent into concave and convex shapes in advance will be described with reference to the drawings. FIG. 12 is a sectional view schematically illustrating one process step in a case where the semiconductor package according to the fourth example of the present invention is connected to a substrate that has been bent into a concave shape in advance.

The support blocks 20 are capable of following up bending and flexing of the substrate 50 owing to the curving thereof in a manner similar to the case where the semiconductor package is mounted on the convexly curved substrate while being subjected to pressure, whereby the substrate on which the semiconductor package has been mounted is made to curve, as illustrated in FIG. 10. As a result, stress at the solder balls 40 is mitigated and problems such as faulty connections no longer occur.

By preparing a curved spacer 64, which conforms to the curvature of the substrate 50 curved in advance, for the concavely curved connection substrate 50, inserting the curved spacer 64 between the support blocks 20 to thereby resiliently deform the support blocks 20 and cause the interposer 30 to conform to the curvature of the substrate 50, as illustrated in FIG. 12, and then connecting the two, it is possible for the support blocks 20 to follow up the bending and flexing of the substrate 50 owing to the curving thereof in a manner similar to the case where the substrate on which the semiconductor package has been mounted is made to curve. As a result, the stress at the solder balls 40 is alleviated and problems such as faulty connections no longer occur. In this case, the curved spacer 64 is removed after the semiconductor package is connected to the substrate 50.

In accordance with the fourth example, it is possible to achieve curving even with a semiconductor chip 10 having the electrode(s) 11 on the side of the second face 10b, which is in the direction facing the side of the substrate 50.

Fifth Example

A semiconductor package according to a fifth example of the present invention will be described with reference to the drawings. FIG. 13 is a sectional view schematically illustrating the structure of a semiconductor package according to the fifth example of the present invention.

The semiconductor package according to the fifth example of the present invention differs from the first to fourth examples in that use is made of a semiconductor chip 10 in which the electrode(s) 11 is disposed not on both opposing sides of the second face 10b but only on one side edge. The semiconductor chip 10 is such that the electrode(s) 11 is provided only on one side edge of the second face 10b. The interposer 30 is electrically connected to the electrode(s) 11 of the semiconductor chip 10 in the vicinity of one end portion of the interposer that has been folded back onto the second face 10b of semiconductor chip 10, and is adhesively secured in the vicinity of its other end portion to the second face 10b of semiconductor chip 10 by an adhesive 70. Other structural elements are similar to those of the first example.

Next, a method of manufacturing the semiconductor package according to the fifth example will be described with reference to the drawings. FIGS. 14A to 14D are process sectional views schematically illustrating a method of manufacturing the semiconductor package according to the fifth example of the present invention.

Figure 14A:
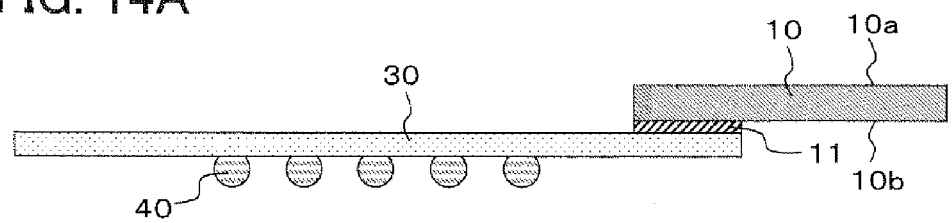
FIGS. 14A to 14D are process sectional views schematically illustrating a method of manufacturing the semiconductor package according to the fifth example of the present invention.
Figure 14B:
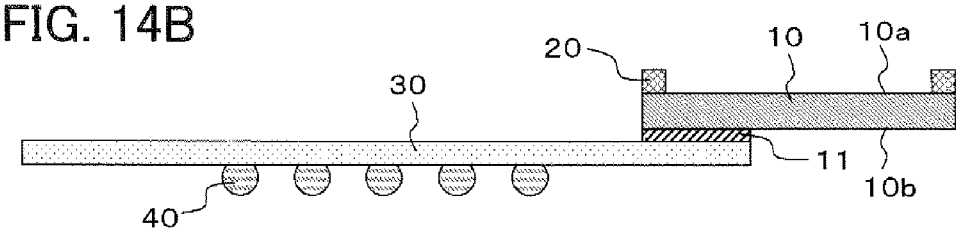

First, after the solder balls 40 are mounted on the interposer 30, the electrode(s) 11 provided on the second face 10b of semiconductor chip 10 and the electrode(s) (not shown) of the interposer 30 are connected by thermo-compression bonding [see FIG. 14A]. Next, the support blocks 20 are placed at prescribed positions on the first face 10a of semiconductor chip 10 [see FIG. 14B]. Although it is preferred that the support blocks 20 be adhesively secured to the first face 10a of the semiconductor chip 10, they need not necessarily be adhesively secured.

Figure 14C:
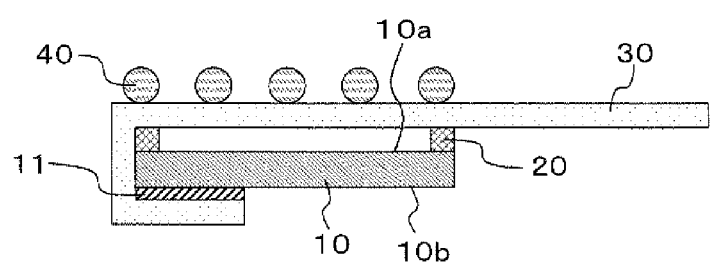
Figure 14D:
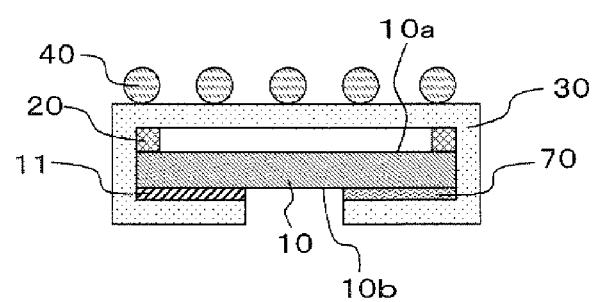
Figure 21:
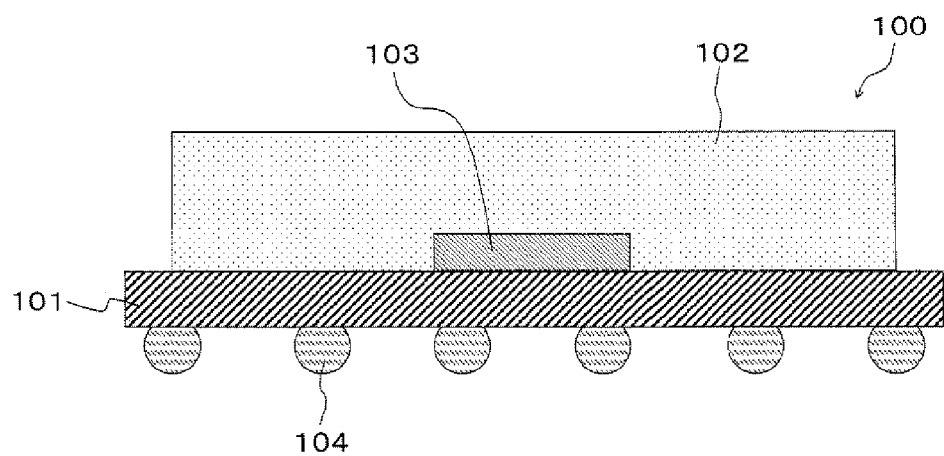
FIG. 21 is a sectional view schematically illustrating the structure of a semiconductor package according to a first example of the conventional art.
Figure 22:
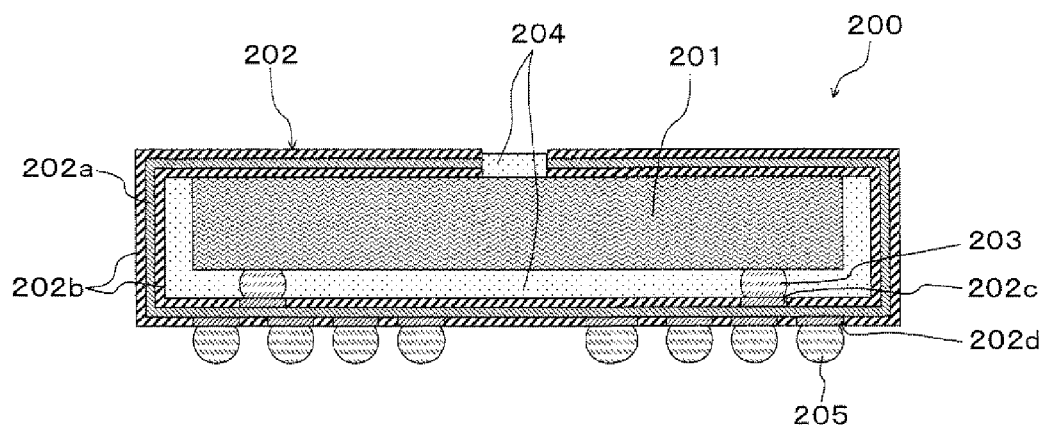
FIG. 22 is a sectional view schematically illustrating the structure of a semiconductor package according to a second example of the conventional art.

Next, the interposer 30 is folded back so as to be supported on the support blocks 20 that have been placed on the semiconductor chip [see FIG. 14C]. The interposer 30 is then folded back onto the second face 10b of semiconductor chip 10 and this folded end portion of the interposer 30 is adhesively secured to the second face 10b of semiconductor chip 10 by the adhesive 70 [FIG. 14D]. The resulting semiconductor package 1 is mounted on the substrate 50, as illustrated in FIG. 13.

The method of curving the semiconductor device according to the fifth example is similar to that of the first example.

The fifth example provides effects similar to those of the first example and is structurally advantageous in that the electrode 11 of the semiconductor chip 10 and the interposer 30 can be electrically connected by thermo-compression bonding without utilizing a spacer.

A semiconductor device according to a sixth example of the present invention will now be described with reference to the drawings. FIG. 15 is a sectional view schematically illustrating the structure of a semiconductor package according to the sixth example of the present invention.

The semiconductor package according to the sixth example differs from that of the fifth example in that the end portion of one side of the interposer 30 is not folded back onto the first face 10a of the semiconductor chip 10. Other structural elements are similar to those of the fifth example. The end portion of the interposer 30 on the side opposite the end portion connected to the electrode(s) 11 of the semiconductor chip 10 is adhesively secured to the support blocks 20. Further, support blocks 20a, 20b are both adhesively secured to the first face 10a of the semiconductor chip 10. Assume that the depth direction and lateral direction in FIG. 15 are the directions of length and width, respectively. Preferably, the one end portion of the interposer 30 folded back onto the second face 10b of the semiconductor chip 10 has a length equivalent to that of the support blocks 20a, 20b in order that stress will act upon the support blocks 20a, 20b as uniformly as possible at the time of the curving operation. Although the width of the fold of the interposer 30 is determined from the required area of the electrode(s) 11 and the length, it may be enlarged up to the width of the semiconductor chip 10 if necessary.

In the sixth example, the adhesion area over which the other end portion of the interposer 30 is adhesively secured to the support block 20b is limited. Consequently, there is the danger that the portion where interposer 30 and support block 20b are adhered to each other will separate owing to tension ascribable to elastic deformation of the support block 20b. However, if the adhesive force is strengthened or the coefficient of elasticity of the support block 20b is reduced, this arrangement can be used in a case where curvature is large and tension due to elastic deformation of the interposer 30 is high. Further, the method of manufacturing the semiconductor package and the method of curving it according to the sixth example are similar to those of the fifth example. However, since the end portion on one side of the interposer 30 need not be folded back onto the second face 10b of the semiconductor chip 10, an advantage of this example is that the structure of the interposer 30 can be simplified.

Seventh Example

A semiconductor package according to a seventh example of the present invention will be described with reference to the drawings. FIG. 16 is a sectional view schematically illustrating the structure of a semiconductor package according to the seventh example of the present invention.

The semiconductor package according to the seventh example differs from that of the fourth example in that use is made of a semiconductor chip 10 in which the electrode(s) 11 is not disposed on both opposing sides of the second face 10b but only on the edge portion on one side thereof. The semiconductor chip 10 is such that the electrode(s) 11 is provided only on one side edge of the second face 10b. The interposer 30 is electrically connected to the electrode(s) 11 of the semiconductor chip 10 in the vicinity of the one folded-back end portion of the interposer embracing the support block 20a, and is adhesively secured in the vicinity of its other end portion to the support block 20b adhesively secured to the second face 10b of the semiconductor chip 10.

The support block 20a is provided in a form embraced at the folded portion of the interposer 30. The support block 20b is adhesively secured to the second face 10b of the semiconductor chip 10 at a position near the side opposite the support block 20a. The thicknesses of the support blocks 20a and 20b are made such that the interposer 30 supported spanning the support blocks 20a and 20b will lie parallel with the second face 10b of semiconductor chip 10. The thickness of the support block 20a is made a thickness obtained by subtracting the thicknesses of the electrode 11 and interposer 30 from the thickness of the support block 20b. Although the thickness of the support block 20b can be varied in accordance with the curvature of the substrate 50, it is provided with a thickness such that when the interposer 30 is made curved, the interposer 30 and the second frame memory 20b of the semiconductor chip 10 will not come into contact or such that the folded-back portions of the interposer 30 will not contact each other.

The materials and widths of the support blocks 20a and 20b need not necessarily be the same. By making the coefficient of elasticity of the support block 20a smaller than that of the support block 20b or making the width of the support block 20a smaller than that of the support block 20b, the amounts of elastic deformation of the two support blocks can be equalized, thereby making it possible to make the stress acting upon the solder balls 40 more uniform. Other structural elements are similar to those of the fourth example.

A method of manufacturing the semiconductor package according to the seventh example will be described next with reference to the drawings. FIGS. 17A to 17C are process sectional views schematically illustrating a method of manufacturing the semiconductor package according to the seventh example of the present invention.

First, after the solder balls 40 are mounted on the interposer 30 by a well-known method, the electrode 11 of the semiconductor chip 10 and the electrode(s) (not shown) of the interposer 30 are connected by thermo-compression bonding [see FIG. 17A]. Next, the support block 20a is adhesively secured to the interposer 30 at a prescribed position and the support block 20b is adhesively secured to the second face 10b of the semiconductor chip 10 at a prescribed position [see FIG. 17B]. Next, the interposer 30 is folded twice on the outer side of the support block 20a so as to embrace the support block 20a, and the leading end of the folded interposer 30 is adhesively secured to the support block 20b [see FIG. 17C]. The resulting semiconductor package is mounted on the substrate 50 in the manner shown in FIG. 16.

The method of curving the semiconductor package according to the seventh example is similar to that of the fourth example. However, since the end portion on one side of the interposer 30 need not be folded back onto the second face 10b of the semiconductor chip 10, an advantage of this example is that the structure of the interposer 30 can be simplified.

Eighth Example

A semiconductor package according to an eighth example of the present invention will be described with reference to the drawings. FIG. 18A is a plan view schematically illustrating the structure of a semiconductor package according to an eighth example of the present invention, 18B an enlarged sectional view taken along line X-X' and 18C a sectional view taken along line Y-Y'.

The semiconductor package according to the eighth example employs a semiconductor chip 10 in which the electrodes) 11 is not placed on both of the opposing edges of the second face 10b but only on the edge on one side. The support blocks 20 are adhesively secured to the first face 10a of the semiconductor chip 10 in the vicinity of any three sides. Further, three sides of the interposer 30 are folded back onto the second face 10b of semiconductor chip 10 on the outer sides of the support blocks 20, and the interposer 30 is electrically connected to the electrode(s) 11 of the semiconductor chip 10 in the vicinity of the folded end portion of one side and is adhesively secured to the second face 10b of the semiconductor chip 10 in the vicinity of the end portions of the remaining two sides. Other structural elements are similar to those of the first example.

The support block 20 can employ a material similar to that of the first example. With regard to the size of the support block 20, assume that the direction parallel to the sides of the semiconductor chip 10 is the direction of length, that the vertical direction in FIG. 18B is the direction of thickness and that the remaining one side is width. Preferably, the length is made one-third or more of the length of the semiconductor chip 10 in order that stress acting upon the solder balls 40 will be mitigated as uniformly as possible, the width is made less than one-fourth that of the semiconductor chip 10 in order to facilitate elastic deformation in the inner side, and the thickness, which can be varied in accordance with the curvature of a substrate 50, is made a height such that the first face 10a of the semiconductor chip 10 will not be contacted when the interposer 30 is made to curve. The placement of the support blocks 20 on each of the sides of the semiconductor chip 10 is performed taking into consideration the fact that the interposer 30 will be curved three-dimensionally from near the center of the semiconductor chip 10. Hence the support blocks are placed on the three sides in balanced fashion.

With regard to the interposer 30, assume that the direction parallel to the sides of the semiconductor chip 10 in FIG. 18A is the direction of length and that the direction perpendicular to this direction is the direction of width. Preferably, the length is made equal to or greater than that of the support block 20 in order that stress will act upon the support block 20 as uniformly as possible when the interposer 30 is made to curve, and the width of the fold of the interposer 30 on the side of the electrode(s) 11 is determined from the required area of the electrode(s) 11 and the above-mentioned length. Further, with regard to the interposer 30, the width of the fold of the interposer on the portion of the adhesive 70 is decided taking into consideration the adhered area and the adhesive strength. The width is made one which can assure enough of an adhered area to withstand tension when the support block 20 is elastically deformed by curving of the interposer 30.

Next, a method of manufacturing the semiconductor package according to the eighth example will be described.

First, in a manner similar to that of the fifth example, the electrode(s) 11 of the semiconductor chip 10 and the electrode(s) (not shown) of the interposer 30 are connected by a thermo-compression bonding method after the solder balls 40 are mounted on the interposer 30. Next, the support blocks 20 are placed near respective ones of the three sides of the first face 10a of semiconductor chip 10 and are adhesively secured to the first face 10a, as illustrated in FIG. 18C.

Next, the interposer 30 is folded back so as to be supported on the support blocks 20 that have been placed on the semiconductor chip 10. Thereafter, the end portions of the interposer 30 are folded twice at the outer sides of the support blocks 20 so as to embrace the support blocks 20, and the leading ends of the folded interposer 30 are adhesively secured to the second face 10b of the semiconductor chip 10. The resulting semiconductor package 1 is mounted on the substrate 50, as illustrated in FIG. 18B.

Described next will be a case where the semiconductor package according to the eighth example is made to curve three-dimensionally from the center thereof.

When the substrate 50 is curved three-dimensionally into a spherical convex shape, the interposer 30 is urged upward via the solder balls 40. However, since the support blocks 20 have been provided in the vicinity of the three sides of the semiconductor chip 10, they are capable of following up bending and flexing of the substrate 50 owing to the three-dimensional curving thereof. As a result, the stress at the solder balls 40 is alleviated, problems such as faulty connections no longer occur and curving can be achieved three-dimensionally.

When the substrate 50 is curved three-dimensionally into a spherical concave shape, the interposer 30 is urged downward via the solder balls 40. However, since the support blocks 20 have been provided similarly in the vicinity of the three sides of the semiconductor chip 10, they are capable of following up bending and flexing of the substrate 50 owing to the three-dimensional curving thereof. As a result, the stress at the solder balls 40 is alleviated, problems such as faulty connections no longer occur and curving can be achieved three-dimensionally.

Next, a case where the semiconductor package according to the eighth example is connected to a substrate that has been bent three-dimensionally into a spherical convex shape in advance will be described.

Since the support blocks 20 have been provided on the three sides, they are capable of following up the bending and flexing of the substrate 50 due to the three-dimensional curving thereof in a manner similar to the case where the semiconductor package is mounted on the three-dimensionally spherically convexly curved substrate while being subjected to pressure, whereby the substrate on which the semiconductor package has been mounted is made to curve. As a result, stress at the solder balls 40 is mitigated, problems such as faulty connections no longer occur and curving can be achieved three-dimensionally.

Ninth Example

A semiconductor package according to a ninth example of the present invention will be described with reference to the drawings. FIG. 19A is a plan view schematically illustrating the structure of a semiconductor package according to a ninth example of the present invention, 19B an enlarged sectional view taken along line X-X' and 19C a sectional view taken along line Y-Y'.

In the semiconductor package according to the ninth example, end portions of the interposer 30 other than the portion connected to the electrode(s) 11 of the semiconductor chip 10 are not folded back onto the second face 10b of the semiconductor chip 10 but are adhesively secured to the support blocks 20 placed on the sides other than the side in the vicinity of the electrode(s) 11. Further, the support blocks 20 are adhesively secured to the semiconductor chip 10. Other structural elements are similar to those of the eighth example.

In the ninth example, the adhesion areas over which the end portions on the two sides of the interposer 30 are adhesively secured to the support blocks 20 are limited. Consequently, there is the danger that the adhered portions where the interposer 30 and support blocks 20 are adhered to each other will separate owing to tension ascribable to elastic deformation of the support blocks 20. However, if the adhesive force is strengthened or the coefficient of elasticity of the support blocks 20 reduced, this arrangement can be used in a case where curvature is large and tension due to elastic deformation of the interposer 30 is high.

The method of curving the semiconductor chip according to the ninth example is similar to that of the eighth example. However, an advantage of this example is that since the interposer 30 need not be folded back onto the second face 10b of the semiconductor chip 10, the interposer 30 can be simplified.

Tenth Example

A semiconductor package according to a tenth example of the present invention will be described with reference to the drawings. FIG. 20A is a plan view schematically illustrating the structure of a semiconductor package according to a tenth example of the present invention, 20B an enlarged sectional view taken along line X-X' and 20C a sectional view taken along line Y-Y'.

The semiconductor package according to the tenth example employs a semiconductor chip 10 in which the electrode(s) 11 is not placed on both of the opposing sides of the second face 10b but only on the edge on one side. The support blocks 20 are adhesively secured to the first face 10a of the semiconductor chip 10 in the vicinity of respective ones of the four sides. Further, four sides of the interposer 30 are folded back onto the second face 10b of semiconductor chip 10 on the outer sides of the support blocks 20, and the interposer 30 is electrically connected to the electrodes 11 of the semiconductor chip 10 in the vicinity of the folded edge of one side and is adhesively secured to the second face 10b of the semiconductor chip 10 in the vicinity of the edges of the remaining three sides. Other structural elements are similar to those of the first example.

The support block 20 can employ a material similar to that of the first example. With regard to the size of the support block 20, assume that the direction parallel to the sides of the semiconductor chip 10 is the direction of length, that the vertical direction in FIG. 20B is the direction of thickness and that the remaining one side is width.

Preferably, the length is equivalent to the length of the range over which the solder balls 40a have been mounted on the interposer 30 in order that stress acting upon the solder balls 40 is mitigated as uniformly as possible, the width is made less than one-fourth that of the semiconductor chip 10 in order to facilitate elastic deformation in the inner side, and the thickness, which can be varied in accordance with the curvature of a substrate 50, is made a height such that the first face 10a of the semiconductor chip 10 will not be contacted when the interposer 30 is made to curve. The placement of the support blocks 20 on each of the sides of the semiconductor chip 10 is performed taking into consideration the fact that the interposer 30 will be curved three-dimensionally from near the center of the semiconductor chip 10. Hence the support blocks 20 are placed in such a manner that the center of each side in the length direction and the center of the support blocks 20 in the length direction will coincide in order to make the stress acting upon the solder balls 40 as uniform as possible.

With regard to the interposer 30, assume that the direction parallel to the sides of the semiconductor chip 10 in FIG. 20A is the direction of length and that the direction perpendicular to this direction is the direction of width. Preferably, the length is made equal to or greater than that of the support block 20 in order that stress will act upon the support block 20 as uniformly as possible when the interposer 30 is made to curve, and the width of the fold of the interposer 30 on the side of the electrode(s) 11 is determined from the required area of the electrode(s) 11 and the above-mentioned length. Further, the width of the fold of the interposer on the portion of the adhesive 70 is decided taking into consideration the adhered area and the adhesive strength. The width is made one which can assure enough of an adhered area to withstand tension when the support block 20 is elastically deformed by curving of the interposer 30.

Next, a method of manufacturing the semiconductor package according to the tenth example will be described.

First, in a manner similar to that of the eighth example, the electrode 11 of the semiconductor chip 10 and the electrode (not shown) provided near the one side edge of the interposer 30 are connected by a thermo-compression bonding method after the solder balls 40 are mounted on the interposer 30. Next, the support blocks 20 are placed near respective ones of the four sides of the first face 10a of semiconductor chip 10 and are adhesively secured to the first face 10a, as illustrated in FIG. 20C.

Next, the interposer 30 is folded back so as to be supported on the support blocks 20 that have been placed on the semiconductor chip 10. Thereafter, the end portions of the interposer 30 are folded twice at the outer sides of the support blocks 20 so as to embrace the support blocks 20, and the leading ends of the folded interposer 30 are adhesively secured to the second face 10b of the semiconductor chip 10. The resulting semiconductor package 1 is mounted on the substrate 50, as illustrated in FIG. 20B.

Described next will be a case where the semiconductor package according to the tenth example is made to curve three-dimensionally from the center thereof. In a case where the substrate on which the semiconductor package according to the tenth example has been mounted is curved into a spherical shape from the center thereof, the fact that the support blocks 20 have been provided on respective ones of the four sides of the first face 10a of semiconductor chip 10 has the effect of making the stress that acts upon the solder balls 40 more uniform.

It should be noted that the sectional shape of the support blocks illustrated in the first to tenth examples is not limited to that shown. The support blocks can have the cross section of a trapezoid, an inverted trapezoid, a barrel with a bulging middle portion, a barrel with a narrowed middle portion or one with a cut-away middle portion. In particular, in the case of the shape where the middle portion is narrowed or cut away, this has the effect of facilitating elastic deformation and of increasing the suppleness of the curved shape.

In the semiconductor packages according to the first to tenth examples, examples in which a semiconductor chip is mounted have been illustrated. However, the invention may be applied to semiconductor parts such as a semiconductor device in which a wiring layer is formed in a semiconductor chip, a semiconductor package in which a semiconductor device is sealed in resin, and a semiconductor package in which a semiconductor device is mounted on a substrate.

Further, in the semiconductor packages according to the first to tenth examples, examples in which solder balls are used in the electrical connection between a semiconductor package and a substrate have been illustrated. However, it will suffice to use an electrically conductive member with which an electrical connection is possible, and a configuration in which an electrically conductive paste or a cream solder has been applied to the electrode portions of the semiconductor package or substrate is permissible.

Further, in the semiconductor packages according to the first to tenth examples, examples in which the interposer has a three-layer structure, in which an intermediate layer constituting a wiring pattern is sandwiched between two layers of thermoplastic resin film, have been illustrated. However, the layer structure is not limited to that of the first to tenth examples. It will suffice if the structure is one in which the electrodes and substrate of a semiconductor part such as a semiconductor chip and semiconductor package can be curved in a form in which they can be electrically connected.

Furthermore, a semiconductor package according to the first to tenth examples is mounted on a structure such as a curved substrate, and an electronic part having this structure is mounted on an electronic device.

The invention claimed is:

1. A semiconductor package comprising:
   a semiconductor part having electrodes on one face thereof;
   bendable and flexible support blocks disposed at least at two locations on a peripheral edge of said semiconductor part on the other face thereof, the support blocks being made of a resilient material capable of following up of bending and flexing of a substrate; and
   an interposer bridging said support blocks which are situated between said interposer and said semiconductor part, and having a wiring pattern in a flexible resin film, said wiring pattern being electrically connected to the electrodes of said semiconductor part.

2. A semiconductor package according to claim 1, wherein said interposer is so adapted that at least one end portion thereof is folded back onto the side of the one face of said semiconductor part.

3. A semiconductor package according to claim 1, further comprising a space between said support blocks, said space being between said semiconductor part and said interposer.

4. A semiconductor package according to claim 1, wherein said support blocks are adhesively secured to said semiconductor part.

5. A semiconductor package according to claim 1, wherein said support blocks are adhesively secured to said interposer.

6. A semiconductor package according to claim 1, wherein one or more of said support blocks are disposed in parallel with each other in the vicinity of respective ones of a pair opposing sides on the other face of said semiconductor part.

7. A semiconductor package according to claim 6, wherein said interposer has two end portions thereof folded back onto the side of the one face of said semiconductor part, and the wiring pattern is electrically connected to the electrodes of said semiconductor part at the two end portions.

8. A semiconductor package according to claim 6, wherein said interposer has two end portions thereof folded back onto the side of the one face of said semiconductor part, the wiring pattern is electrically connected to the electrodes of said semiconductor part at a first end portion of the two end portions, and a second end portion of the two end portions is adhesively secured to the one face of said semiconductor part.

9. A semiconductor package according to claim 6, wherein said interposer has one end portion thereof folded back onto the side of the one face of said semiconductor part and the wiring pattern is electrically connected to the electrodes of said semiconductor part at the one end portion; and
   said support blocks are adhesively secured to said semiconductor part and to said interposer.

10. A semiconductor package according to claim 1, wherein one or more of said support blocks are disposed on each of three sides of the other face of said semiconductor part.

11. A semiconductor package according to claim 10, wherein said interposer has three end portions thereof folded back onto the side of the one face of said semiconductor part, the wiring pattern is electrically connected to the electrode of said semiconductor part at a first end portion of the three end portions, and second and third end portions among the three end portions are adhesively secured to the one face of said semiconductor part.

12. A semiconductor package according to claim 10, wherein said interposer has one end portion thereof folded back onto the side of the one face of said semiconductor part and the wiring pattern is electrically connected to the electrodes of said semiconductor part at the one end portion; and said support blocks are adhesively secured to said semiconductor part and to said interposer.

13. A semiconductor package according to claim 1, wherein one or more of said support blocks are disposed on each of four sides of the other face of said semiconductor part.

14. A semiconductor package according to claim 13, wherein said interposer has four end portions thereof folded back onto the side of the one face of said semiconductor part, the wiring pattern is electrically connected to the electrodes of said semiconductor part at a first end portion of the four end portions, and second, third and fourth end portions among the three end portions are adhesively secured to the one face of said semiconductor part.

15. A semiconductor package according to claim 1, wherein said support block(s) comprises a thermoplastic resin that is softened by heating.

16. A semiconductor package according to claim 1, wherein said semiconductor part is a semiconductor chip, a semiconductor device in which a wiring layer is formed in said semiconductor chip, said semiconductor package in which said semiconductor device is sealed in said resin, or said semiconductor package in which said semiconductor device is mounted on said substrate.

17. An electronic part having a curved structure on which said semiconductor package set forth in claim 1 is mounted.

18. An electronic device wherein the electronic part set forth in claim 17 is mounted thereon.

19. A semiconductor package according to claim 1, wherein the resilient material has a hardness of less than 60°.

20. A semiconductor package according to claim 1, wherein the resilient material is silicone rubber, nitrile rubber or fluororubber.

21. A semiconductor package according to claim 1, wherein the support blocks have dimensions that can be varied with curvature of the substrate and so that a face of the semiconductor part will not be contacted when the interposer is made to curve.

22. A semiconductor package comprising:

a semiconductor part having electrodes on one face thereof;

an interposer having a wiring pattern in a flexible resin film, said interposer having at least one end folded back onto the side of said semiconductor part and the wiring pattern being electrically connected to the electrodes of said semiconductor part; and a bendable and flexible support block(s) disposed inside said interposer in the vicinity of the folded-back portion of said interposer, the support block(s) being made of a resilient material capable of following up of bending and flexing of a substrate.

23. A semiconductor package according to claim 22, further comprising a space between said semiconductor part and said interposer in the vicinity of said support block(s).

24. A semiconductor package according to claim 22, wherein said support block(s) is adhesively secured to said interposer.

25. A semiconductor package according to claim 22, wherein said interposer has two end portions thereof folded back onto the side of said semiconductor part, and the wiring pattern is electrically connected to the electrodes of said semiconductor part the two end portions; and said support blocks are disposed inside said interposer in the vicinity of respective ones of the two folded-back portions of said interposer.

26. A semiconductor package according to claim 22, further comprising a bendable and flexible second support block(s) disposed between said semiconductor package and said interposer and adhesively secured to said semiconductor package and to said interposer; and said interposer has one end portion thereof folded back onto the side of said semiconductor part and the wiring pattern is electrically connected to the electrodes of said semiconductor part at the one end portion.

27. A semiconductor package according to claim 22, wherein the resilient material has a hardness of less than 60°.

28. A semiconductor package according to claim 22, wherein the resilient material is silicone rubber, nitrile rubber or fluororubber.

29. A semiconductor package according to claim 22, wherein the support blocks have dimensions that can be varied with curvature of the substrate and so that a face of the semiconductor part will not be contacted when the interposer is made to curve.

* * * * *